United States Patent
Jang

(10) Patent No.: US 7,919,808 B2
(45) Date of Patent: Apr. 5, 2011

(54) FLASH MEMORY DEVICE

(75) Inventor: Jeong-Yel Jang, Gyeonggi-do (KR)

(73) Assignee: Dongbu HiTek Co., Ltd., Seoul (KR)

( * ) Notice: Subject to any disclaimer, the term of this patent is extended or adjusted under 35 U.S.C. 154(b) by 60 days.

(21) Appl. No.: 12/391,950

(22) Filed: Feb. 24, 2009

(65) Prior Publication Data

US 2009/0159951 A1 Jun. 25, 2009

Related U.S. Application Data

(63) Continuation of application No. 11/847,614, filed on Aug. 30, 2007, now Pat. No. 7,514,368.

(30) Foreign Application Priority Data

Sep. 6, 2006 (KR) .................. 10-2006-0085489

(51) Int. Cl.
*H01L 29/788* (2006.01)
(52) U.S. Cl. ........ 257/315; 257/623; 438/708; 438/712; 438/735; 438/736; 438/737
(58) Field of Classification Search .................. 438/708, 438/712, 735, 736, 737; 257/315, 623
See application file for complete search history.

(56) References Cited

U.S. PATENT DOCUMENTS

| | | |
|---|---|---|
| 6,724,036 B1 | 4/2004 | Hsieh et al. |
| 2003/0022446 A1* | 1/2003 | Lee et al. .................. 438/257 |
| 2006/0131635 A1 | 6/2006 | Lai et al. |

* cited by examiner

*Primary Examiner* — Matthew S Smith
*Assistant Examiner* — John M Parker
(74) *Attorney, Agent, or Firm* — Sherr & Vaughn, PLLC

(57) ABSTRACT

Embodiments relate to a flash memory device and a method of manufacturing a flash memory device, which may increase a coupling coefficient between a control gate and a floating gate by increasing a surface area of floating gate. In embodiments, a flash memory device may be formed by forming a photoresist pattern for forming a floating gate on a semiconductor substrate including an oxide film, a floating gate poly film, and a BARC (Bottom AntiReflect Coating), performing a first etching process using the photoresist pattern as a mask, to etch the floating gate poly film to a predetermined depth, depositing and forming a polymer to cover the photoresist pattern, forming spacers of the polymer at both sidewalls of the photoresist pattern, forming a second etching process using the spacers as a mask, to expose the oxide film, and removing the BARC, the photoresist pattern and the spacers by ashing and stripping.

4 Claims, 4 Drawing Sheets

FLASH MEMORY DEVICE

CROSS REFERENCE TO PRIOR APPLICATIONS

The present application is a Continuation Application of a U.S. patent application Ser. No. 11/847,614 filed on Aug. 30, 2007 now U.S. Pat. No. 7,514,368, which claims priority under 35 U.S.C. 119 and 35 U.S.C. 365 to Korean Patent Application No. 10-2006-0085489(filed on Sep. 6, 2006), which is hereby incorporated by reference in its entirety.

BACKGROUND

In general, a gate-coupling coefficient may be an important element to determine an efficiency of a memory cell in a 0.13 μm or less-grade flash memory device. The gate-coupling coefficient may have a substantial effect on an electric potential of a floating gate. In a flash memory device having a higher gate-coupling coefficient, the electric potential of the floating gate may be adjacent to a given electric potential of a control gate in the memory cell. Accordingly, performance of a flash memory cell may be improved, including programming and erasing efficiency and rapid reading speed.

The high gate-coupling rate may enable a simplification of chip design, and may lower an operation voltage of a flash memory cell to a lower power-source voltage. That is, an important element to determine the gate-coupling coefficient may be a capacitance between each polysilicon to a tunnel oxide capacitance, that is, a capacitance between a floating gate poly and a control gate poly. As the capacitance between each polysilicon increases and the tunnel oxide capacitance decreases, the gate coupling-coefficient may increase.

FIG. 1 illustrates a stack gate structure of a flash memory device according to the related art. By increasing a surface area of a capacitor between polysilicons 13 and 15 or decreasing a thickness of ONO layer 14, a capacitor effect between polysilicons 13 and 15 may increase. However, as the thickness of ONO layer 14 decrease, an efficiency of a floating gate to store charge carriers may be lowered. In this respect, it may be difficult to decrease the thickness of ONO layer 14 by a large extent.

In fabrication technology for a nonvolatile memory, such as a flash memory device, the thickness of ONO layer 14 may be decreased to a minimum value or its approximation above a predetermined thickness which may be suitable for charge-storing capacity within the floating gate. Also, the gate-coupling coefficient may become higher as the ratio of the surface area of capacitor between polysilicons 13 and 15 to the surface area of tunnel oxide 12 increases. In this case, the surface area of the ONO capacitor may be determined based on a height of the polysilicon and a total width of the polysilicon including an overlap region between floating gate 13 and STI region 11 of substrate 10. Also, the surface area of tunnel oxide capacitor 12 may be determined based on a width of an active cell. Accordingly, the gate coupling may be improved by increasing an overlap region between floating gate 13 and the insulation layer.

To determine the interval between each floating gate, it may be necessary to increase a size of the insulation layer. However, increasing size of the insulation layer may cause an increase in cell size. Accordingly, due to the general trend to decrease cell size, which may cause the decrease in width of active cell of flash memory transistor, the decrease of interval between the insulation layers, and the decrease in the overlap region between the STI and the floating gate, a cell structure and a method of forming a cell structure to improve the gate-coupling coefficient of the nonvolatile memory transistor have been proposed to decrease the size of transistor without the decrease in efficiency of memory chip.

SUMMARY OF THE INVENTION

Embodiments relate to a method of manufacturing a flash memory device, and to a method of manufacturing a flash memory device which may increase a coupling coefficient between a control gate and a floating gate by increasing a surface area of floating gate.

Embodiments relate to a flash memory device that may increase a coupling coefficient between a control gate and a floating gate by increasing a surface area of floating gate, and a method of manufacturing the same.

According to embodiments, a method of manufacturing a flash memory device may include forming a photoresist pattern for forming a floating gate on a semiconductor substrate including an oxide film, a floating gate poly film, and a BARC (Bottom AntiReflect Coating) being sequentially stacked thereon, performing a first etching process using the photoresist pattern as a mask, to etch the floating gate poly film to a predetermined depth, depositing and forming a polymer to cover the photoresist pattern, forming spacers of the polymer at both sidewalls of the photoresist pattern, forming a second etching process using the spacers as a mask, to expose the oxide film, and removing the BARC, the photoresist pattern and the spacers by ashing and stripping.

According to embodiments, a flash memory device may include an oxide layer formed on a semiconductor substrate, and a floating gate poly pattern of step-coverage pattern on the oxide layer.

DRAWINGS

DESCRIPTION

Figure 1:
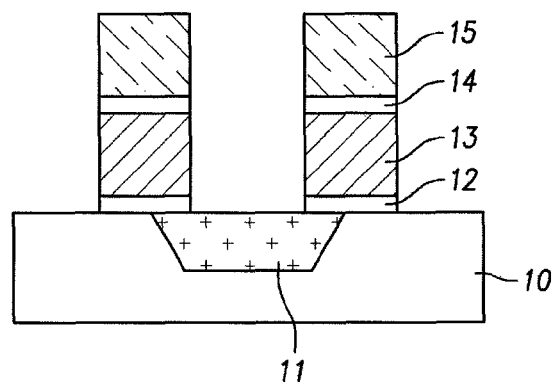
FIG. 1 is a cross section drawing of a flash memory device according to the related art.
Figure 2A:
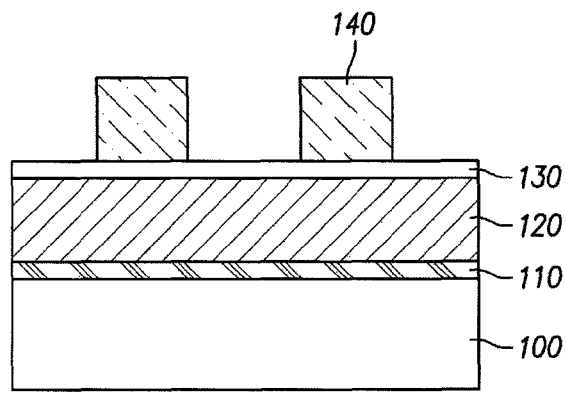
FIGS. 2A to 2F are cross section drawings illustrating a flash memory device and a method of manufacturing a flash memory device according to embodiments.
Figure 2B:
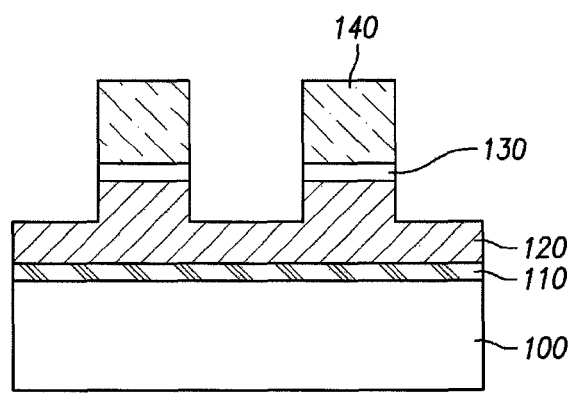

FIGS. 2A and 2B are cross section drawings illustrating a flash memory device and a method of manufacturing a flash memory device according to embodiments. According to embodiments, a surface area of a floating gate may be increased in a method of manufacturing a 0.13 μm or less grade flash memory device, which may increase a coupling coefficient between a control gate and a floating gate.

As illustrated in FIG. 2A, oxide film 110, floating gate poly film 120 and Bottom AntiReflect Coating (BARC) 130 may be sequentially stacked on a semiconductor substrate 100. In embodiments, an etching process using photoresist pattern for KrF lithography 140 to form a floating gate may be carried out.

According to embodiments, by performing the etching process using photoresist pattern for KrF 140 as a mask, as shown in FIG. 2B, floating gate poly film 120 may be etched to a depth between approximately 300Å and 500Å from its upper surface. According to embodiments, the etching process using photoresist pattern for KrF 140 as a mask may use $CF_4$ of 60~100 sccm, Ar of 100~150 sccm and $O_2$ of 5~15 sccm, may be performed for approximately 30 to 60 seconds, while maintaining an atmospheric pressure of approximately 50~80 mT and applying a power of approximately 500~1000 W A polymer may be deposited at a thickness between approximately 1000Å and 1500Å, which may cover photoresist pattern for KrF 140.

Figure 2C:
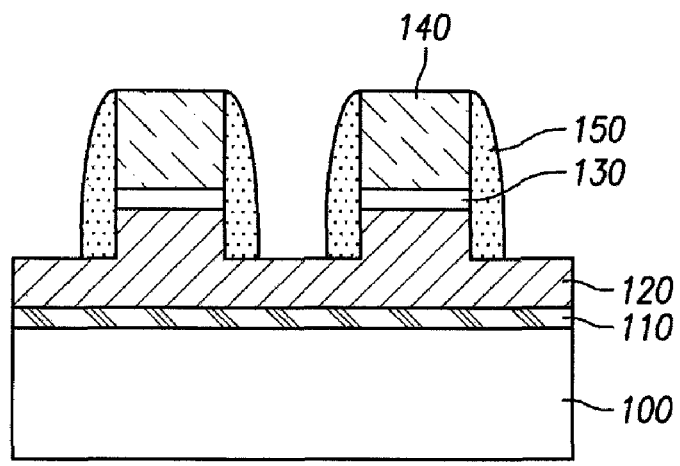

Referring to FIG. 2C, an etch-back process may be performed to the deposited polymer using a predetermined etching method. This may form spacers 150 at both sidewalls of photoresist pattern for KrF 140. For example, to form spacers 150 after depositing the polymer at a thickness between 1000Å and 1500Å, the process may use $C_5F_8$ gas of 5~30 sccm, $CH_2F_2$ gas of 1~15 sccm, Ar gas of 50~200 sccm and $O_2$ gas of 10sccm or less and may be performed for 10 to 40 seconds, while maintaining an atmospheric pressure of 20~50 mT and applying a power of 500~1000 W.

Figure 2D:
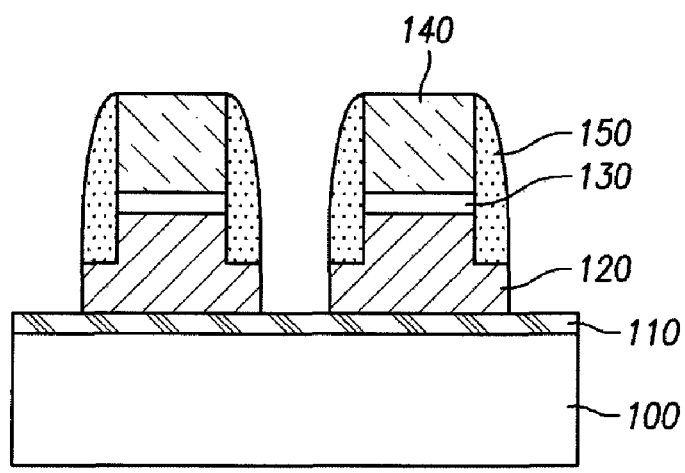

Referring to FIG. 2D, after forming spacers 150 at both sidewalls of photoresist pattern for KrF 140, a dry etching process using spacers 150 as a mask may be performed to floating gate poly film 120, and may expose oxide film 110.

The etching process for floating gate poly film 120 to expose oxide film 110 may use a reactive ion etching (RIE) method.

Figure 2E:
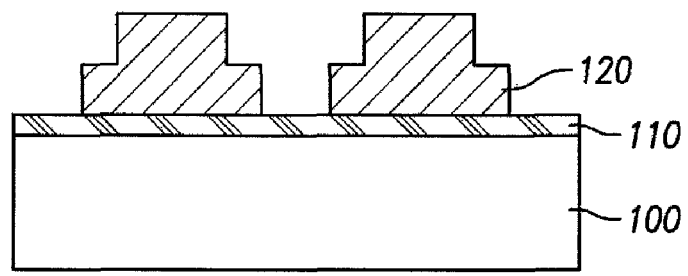
Figure 2F:
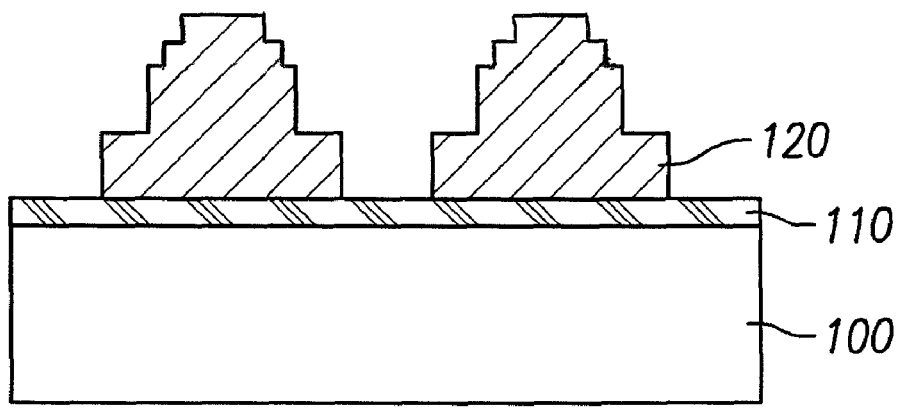

After dry-etching the floating gate poly film to expose oxide film 110, BARC 130, photoresist pattern for KrF 140 and spacers 150, except floating gate poly film 120, may be removed, for example by ashing and stripping. This may form floating gate poly pattern 120, as shown in FIG. 2E. According to embodiments, floating gate poly pattern 120 may be realized with two step coverage. That is, floating gate poly pattern 120 may include a stepped design, with one portion wider than the other. Furthermore, floating gate poly pattern 120 may be embodied in a structure having a plurality of step coverage or having one or more grooves in its upper surface of upper stage.

Figure 3:
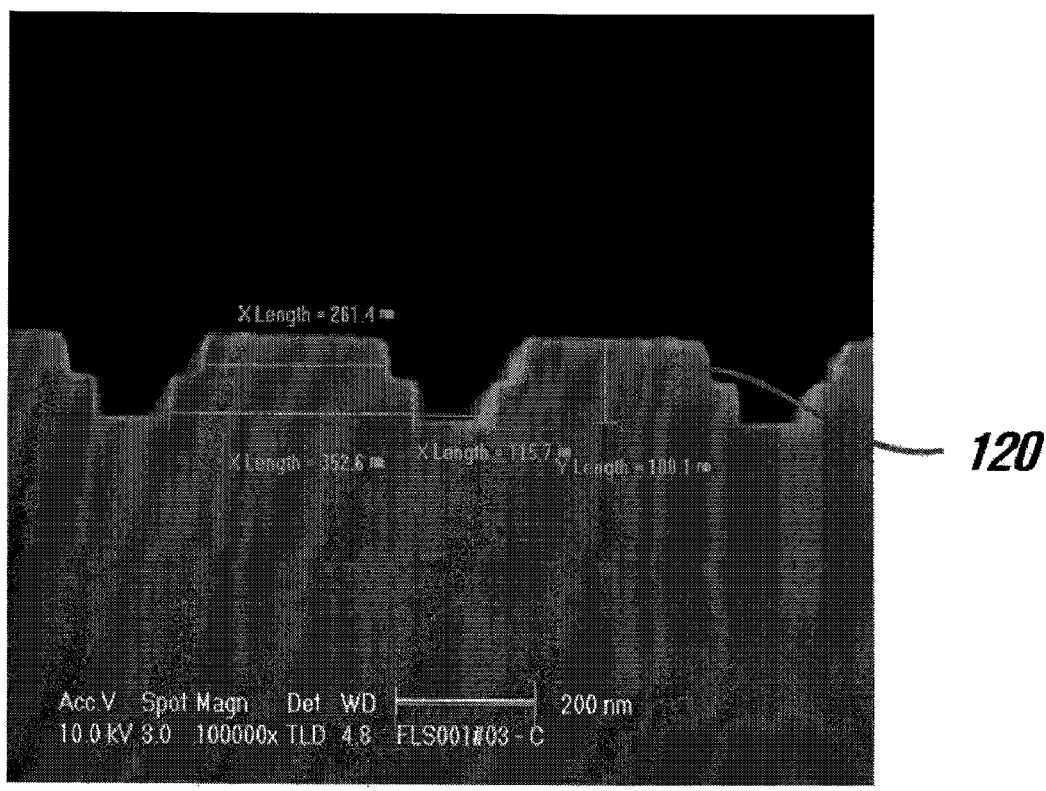
FIG. 3 is a Scanning Electron Microscope (SEM) cross section view of a flash memory device according to embodiments.

As shown in FIG. 3, floating gate poly pattern 120 may increase in its surface area, whereby the capacitance between the polysilicons may also be increased to thereby increase the gate-coupling coefficient.

The high gate-coupling coefficient may enable the fabrication of a small-sized memory cell having high programming and erasing efficiency and rapid reading speed. According to embodiments, the flash memory device may include a flash memory cell, an EEPROM cell, and all kinds of nonvolatile memory cell having a floating gate.

According to embodiments, the flash memory device and the method of manufacturing the flash memory device may have various advantages.

For example, as a surface area of the floating gate increases in size, the coupling coefficient between the control gate and the floating gate may also be increased, so that it is possible to manufacture the small-sized memory cell having the high efficiency of programming and erasing and the rapid reading speed.

It will be apparent to those skilled in the art that various modifications and variations can be made to embodiments. Thus, it is intended that embodiments cover modifications and variations thereof within the scope of the appended claims. It is also understood that when a layer is referred to as being "on" or "over" another layer or substrate, it can be directly on the other layer or substrate, or intervening layers may also be present.

What is claimed is:

1. A floating gate, comprising:
   a first polysilicon tier formed over an oxide layer, having a first width;
   a second polysilicon tier formed over the first polysilicon tier, having a second width narrower than the first width; and
   a plurality of polysilicon tiers formed over the second polysilicon tier, each of the plurality of polysilicon tiers having a narrower width than a preceding polysilicon tier.

2. The floating gate of claim 1, wherein each of the tiers is formed from a single polysilicon layer that is etched to form the tier structure.

3. The floating gate of claim 2, wherein a height of each polysilicon tier is approximately 300 to 500Å.

4. The floating gate of claim 2, wherein an upper surface of the second polysilicon tier of the floating gate comprises a plurality of grooves formed in the upper surface.

* * * * *